(12) United States Patent
Misra et al.

(10) Patent No.: US 11,545,365 B2
(45) Date of Patent: Jan. 3, 2023

(54) CHEMICAL PLANARIZATION

(71) Applicant: CHEMPOWER CORPORATION, Beaverton, OR (US)

(72) Inventors: Sudhanshu Misra, Beaverton, OR (US); Suryadevara Babu, Portland, OR (US)

(73) Assignee: CHEMPOWER CORPORATION, Beaverton, OR (US)

( * ) Notice: Subject to any disclaimer, the term of this patent is extended or adjusted under 35 U.S.C. 154(b) by 0 days.

(21) Appl. No.: 15/931,556

(22) Filed: May 13, 2020

(65) Prior Publication Data
US 2020/0365412 A1 Nov. 19, 2020

Related U.S. Application Data

(60) Provisional application No. 62/920,720, filed on May 13, 2019.

(51) Int. Cl.
*B24D 3/32* (2006.01)
*B24B 37/22* (2012.01)
(Continued)

(52) U.S. Cl.
CPC ........ *H01L 21/3212* (2013.01); *B24B 21/008* (2013.01); *B24B 37/22* (2013.01);
(Continued)

(58) Field of Classification Search
CPC ............... H01L 21/3212; H01L 21/306; H01L 21/30604; B24B 21/008; B24B 37/22;
(Continued)

(56) References Cited

U.S. PATENT DOCUMENTS

| 6,875,097 B2 * | 4/2005 | Grunwald ............. B24B 37/245 |
| | | 451/533 |
| 7,264,641 B2 * | 9/2007 | Prasad .................... B24B 37/22 |
| | | 257/E21.304 |

(Continued)

OTHER PUBLICATIONS

Penta, N. et al., "Role of Poly(diallyldimethylammonium chloride) in Selective Polishing of Polysilicon over Silicon Dioxide and Silicon Nitride Films," Langmuir, vol. 27, No. 7, Feb. 28, 2011, 9 pages.

(Continued)

*Primary Examiner* — Eileen P Morgan
(74) *Attorney, Agent, or Firm* — Alleman Hall Creasman & Tuttle LLP

(57) ABSTRACT

Examples are disclosed that relate to planarizing substrates without use of an abrasive. One example provides a method of chemically planarizing a substrate, the method comprising introducing an abrasive-free planarization solution onto a porous pad, contacting the substrate with the porous pad while moving the porous pad and substrate relative to one another such that higher portions of the substrate contact the porous pad and lower portions of the substrate do not contact the porous pad, and removing material from the higher portions of the substrate via contact with the porous pad to reduce a height of the higher portions of the substrate relative to the lower portions of the substrate.

13 Claims, 4 Drawing Sheets

(51) Int. Cl.
  *B24B 37/24* (2012.01)
  *H01L 21/321* (2006.01)
  *C09G 1/18* (2006.01)
  *B24B 21/00* (2006.01)
  *B24D 11/00* (2006.01)

(52) U.S. Cl.
  CPC ............... *B24B 37/24* (2013.01); *B24D 3/32* (2013.01); *B24D 11/003* (2013.01); *C09G 1/18* (2013.01)

(58) Field of Classification Search
  CPC .. B24B 37/24; C09G 1/18; B24D 3/32; B24D 11/003
  USPC .................................................. 451/530, 533
  See application file for complete search history.

(56) References Cited

U.S. PATENT DOCUMENTS

| | | | |
|---|---|---|---|
| 10,233,356 B2* | 3/2019 | Theivanayagam | C09G 1/06 |
| 2005/0101228 A1* | 5/2005 | Prasad | B24B 37/22 |
| | | | 451/41 |
| 2007/0037491 A1* | 2/2007 | Li | B24B 37/24 |
| | | | 451/41 |
| 2011/0076928 A1* | 3/2011 | James | B24B 37/24 |
| | | | 451/548 |
| 2013/0040543 A1* | 2/2013 | Feng | B24D 11/001 |
| | | | 451/527 |
| 2016/0136778 A1* | 5/2016 | Feng | B24D 18/0027 |
| | | | 451/532 |
| 2018/0345447 A1* | 12/2018 | Saito | B24B 37/22 |

OTHER PUBLICATIONS

Pandija, S. et al., "Chemical mechanical planarization of copper using abrasive-free solutions of oxalic acid and hydrogen peroxide," Materials Chemistry and Physics, vol. 102, No. 2, Apr. 15, 2007, 8 pages.

Ranaweera, C. et al., "Ammonium Persulfate and Potassium Oleate Containing Silica Dispersions for Chemical Mechanical Polishing for Cobalt Interconnect Applications," ECS Journal of Solid State Science and Technology, vol. 8, No. 5, Dec. 11, 2018, 9 pages.

Penta, N. et al., "Charge Density and pH Effects on Polycation Adsorption on Poly-Si, SiO2, and Si3N4 Films and Impact on Removal During Chemical Mechanical Polishing," ACS Applied Materials & Interfaces, vol. 3, No. 10, Sep. 22, 2011, 7 pages.

Lagudu, U. et al., "Reactive Liquids for Non-Prestonian Chemical Mechanical Polishing of Polysilicon Films," ECS Journal of Solid State Science and Technology, vol. 8, No. 5, Feb. 2, 2019, 7 pages.

\* cited by examiner

CHEMICAL PLANARIZATION

CROSS REFERENCE TO RELATED APPLICATION(S) (IF APPLICABLE)

This application claims priority to U.S. Provisional Patent Application Ser. No. 62/920,720, filed May 13, 2019 and titled INNOVATIVE PLANARIZATION USING CHEMICALLY FORMULATED POROUS MATRIX, the entirety of which is hereby incorporated herein by reference.

BACKGROUND

Chemical mechanical planarization (CMP) is commonly used in integrated circuit fabrication processes to smooth surfaces, such as that of a semiconductor substrate, by removal of material using a combination of chemical and mechanical forces. A typical CMP process involves using an abrasive and a chemical slurry that can be corrosive to the material being removed, in combination with a polishing pad. The substrate and polishing pad are pressed together, and rotated relative to one another with non-concentric axes of rotation. The combination of the force and slurry removes areas of the substrate with a higher topology compared to areas with a lower topology, thereby smoothing the surface.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to planarizing substrates without use of an abrasive. One example provides a method of chemically planarizing a substrate, the method comprising introducing an abrasive-free planarization solution onto a porous pad, contacting the substrate with the porous pad while moving the porous pad and substrate relative to one another such that higher portions of the substrate contact the porous pad and lower portions of the substrate do not contact the porous pad, and removing material from the higher portions of the substrate via contact with the porous pad to reduce a height of the higher portions of the substrate relative to the lower portions of the substrate.

Another example provides porous pad for performing chemical planarization of a substrate, a first polymer layer configured to contact the substrate during planarization, the first polymer layer comprising a first, larger average pore size and a first, lesser thickness, and a second polymer layer positioned on an opposite side of the first polymer layer as a substrate-contacting side of the first polymer layer, the second polymers layer comprising a second, smaller average pore size and a second, greater thickness.

DETAILED DESCRIPTION

Figure 1:
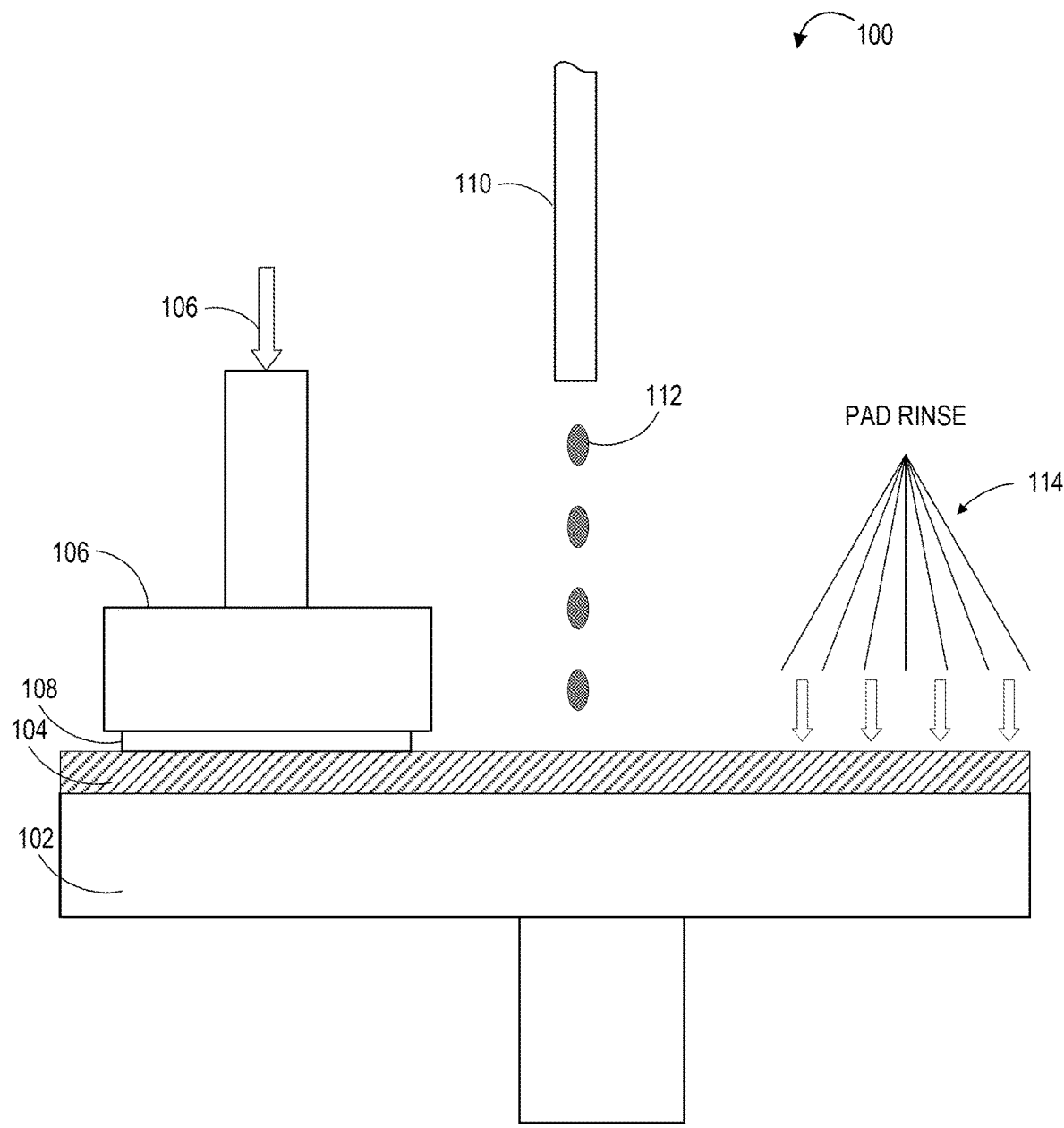
FIG. 1 shows a block diagram of an example chemical planarization system.

While current methods of CMP find use in a wide variety of device fabrication contexts, current CMP methods also pose various drawbacks. For example, current CMP processes are relatively dirty compared to other fabrication processes, due at least in part to the use of conditioner chemicals, as well as the abrasive slurry and pad that mechanically abrade the material during planarization. Defects generated by CMP can be large yield loss contributors to fabs. Defects and scratches generated during CMP may largely originate from the mechanical components in the process, such as the abrasives in the slurry, the force of the pad against the substrate, pad conditioning, and tribological aspects of the process. Further, the slurry contains abrasives that can scratch device layers, thereby creating pits and leaving residues that can become killer defects. Additionally, pad debris is generated during polish and pad conditioning. Such pad debris can create particles and agglomerates that contaminate the substrate being processed. Also, the force of the pad against the wafer can cause pad deformation. This can result in shear stresses at interfaces from intimate contact with the substrate and relative motion between the substrate and pad. Further, CMP processes may not be predicable, and thus may be dominated by trial-and-error approaches, rather than analytical approaches. Further still, the handling, delivering and stabilization of slurries can pose difficulties for fabrication facilities due to solid content. This can increase facilities maintenance costs. As a result, conventional CMP processes can require redundancy in deposition and overpolishing, which can lead to wasted resources, increased costs, and lower productivity.

Accordingly, examples are disclosed herein that relate to performing planarization chemically, without the dirty and defect-prone mechanical processes used in conventional CMP methods. Briefly, the disclosed examples utilize an abrasive-free planarization solution instead of an abrasive slurry, and selectively remove material from topographically higher portions of a substrate at a higher rate than from lower portions of a substrate by controlled contact of the planarization solution to the substrate surface. The term "abrasive-free" indicates a planarization solution without a mechanically abrasive solid component for removing substrate material. As described in more detail below, in some examples the abrasive-free planarization chemistry resides in a porous pad, rather than on top of the pad between the pad and substrate. In this manner, the substrate can be controlled to contact topologically higher features of the substrate to the porous pad, and not contact topologocially lower features of the substrate. Planarization chemistry is exposed to portions of the substrate in contact with the porous pad, thereby selectively removing material from those portions of the substrate. In this manner, the topology of the substrate surface may be made smoother without using abrasives, and by applying only relatively light pressure against the substrate. This may help to avoid scratching or otherwise damaging the device layer, thereby helping to avoid defects and potentially improving yields over conventional CMP processes.

FIG. 1 shows a schematic depiction of an example chemical planarization system 100 according to the present disclosure. System 100 comprises a platen 102 that supports a porous pad 104. The system 100 further includes a substrate holder 106 configured to hold a substrate 108 against the surface of the porous pad 104, and a planarization solution introduction system 110 for introducing a planarization solution 112 onto the porous pad 104. The system 100 further may comprise a pad rinsing system 114 configured to rinse possible contaminant materials from the porous pad 104, such as complexed materials that have been removed from the surface of the substrate 108. Pad rinsing system 114 also may be used to clean the pad between using different planarization solution chemistries, as described below. Other components (not shown) that may be incorporated into system 100 include, but are not limited to, a spent solution recovery system, a materials recirculation system (e.g. for recirculating the planarization solution in a closed loop process), and a species stripping system.

In conventional CMP processes, the substrate holder pushes the substrate against a polishing pad supported on a platen, and the pad and the substrate are rotated relative to one another in a non-concentric pattern. In such conventional processes, relatively high rates of rotations are used, such as between 40-100 rpm. Further, the substrate is pushed against the pad with a relatively high pressure, such as in a range of 1-4 pound per square inch. In contrast, a lighter pressure can be used in the disclosed examples, including but not limited to pressures in the range of 0.25 to 0.75 pounds per square inch. The lighter pressure may avoid distortion of the pad shape, and may reduce shear stresses compared to conventional CMP processes. Likewise, a slower rate of rotation may be used in the disclosed examples than with conventional CMP processes, as the rotational motion is not used for abrasion. Instead, rotation of the platen 102 helps to distribute planarization fluid across the porous pad 104. Any suitable rate of rotation may be used. Examples include, but are not rates in a range of 0-60 rpm, preferably 5-30 rpm.

The planarization solution may comprise chemical components to hydrolyze a substrate material (e.g. by oxidation and dissolution). The planarization solution may be configured to remove any suitable materials. As one example, polysilicon may be removed via a planarization solution comprising poly(diallyldimethylammonium chloride) (PDADMAC) in deionized water. In some such examples, the PDADMAC solution may be mixed with oxalic acid and/or hydrogen peroxide, and further may comprise a suitable acid or alkaline agent (e.g. nitric acid or potassium hydroxide) to adjust the pH. Other reagents also may be used to planarize polysilicon, including but not limited to poly (dimethylamine-co-epichlorohydrin-co-ethylenediamine), poly(allylamine), and poly(ethylene imine) (PEI). In other examples, copper or cobalt may be removed using a planarization solution comprising hydrogen peroxide and guanidine carbonate, again with pH adjusters to achieve a desired solution pH. As another example, ammonium persulfate may be used for cobalt removal, with pH adjusters to achieve a desired solution pH. Other examples of suitable hydrolyzing agents may include, but are not limited to, nitric acid, sulfuric acid, hydrochloric acid, and phosphoric acid.

In some examples, the planarization solution may comprise additional components. For example, the planarization solution may comprise complexing/chelating agents to transport removed material from the substrate after hydrolysis. Examples of suitable chelating agents may include, but are not limited to, ethylenediaminetetraacetic acid (EDTA), sulfosalicylic acid, napthol (PAN), dithizone, organophosphorus acid esters, polyethylene glycol, amines, and thioxine. Further, in some examples, the planarization solution may comprise passivating agents and/or corrosion inhibitors. Examples include, but are not limited to, benzatriazoles (BTA), tolyltriazoles (TTA), thiols (e.g. PTAT (5-(phenyl)-4H-1,2-4-triazole-3-thiol)), thiodiazoles, carboxylic acids, benzoic acid, and ammonium benzoate. Other examples of materials that may be included in the planarization solution include, but are not limited to, surfactants, surface modifiers other than passivation and/or corrosion inhibitors, catalysts, thermally activated chemicals, light activated chemicals, species tracers, additives, and stabilizers.

In some examples, hydrolyzing agents and complexing agents may be bonded to functionalized polymers of the porous pad, as described in more detail below. In such examples, the planarization solution dispensed onto the porous pad may include deionized water, and the chemical planarization may be performed by the functionalized polymers. In such examples, the planarization solution may include additional components other than deionized water, as described above.

Figure 2:
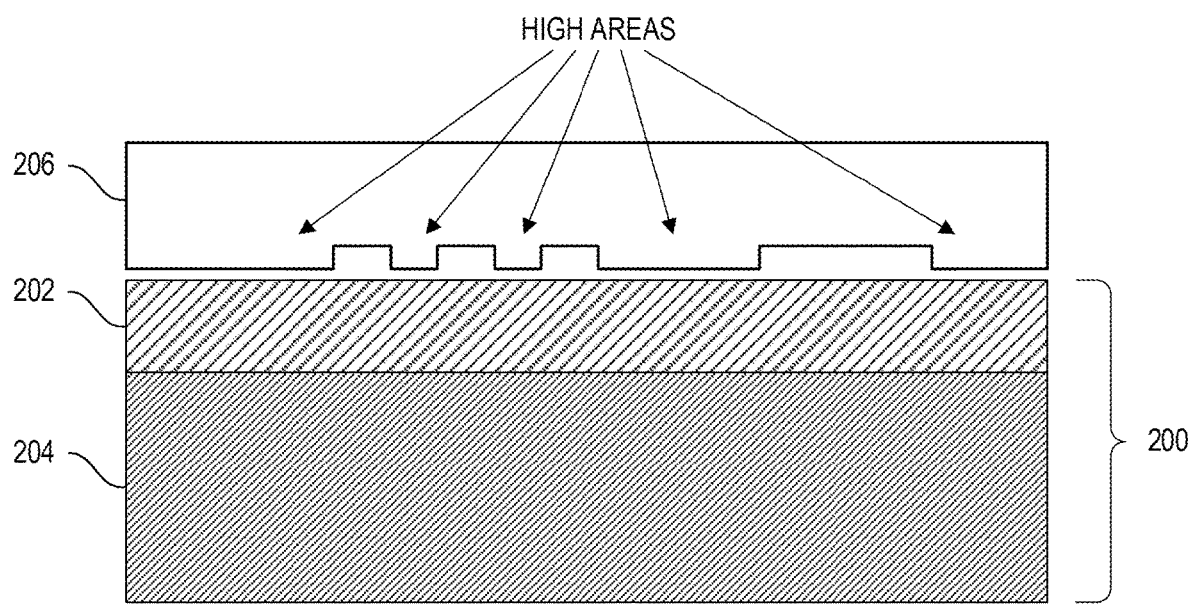
FIG. 2 shows a schematic depiction of an example porous pad for performing chemical planarization, and illustrates contact between topologically higher portions of a substrate and an upper layer of the pad.

FIG. 2 shows a schematic view of an example porous pad 200 that is suitable for use as porous pad 104. The porous pad 200 includes a first layer 202 and a second layer 204. Such a dual layer structure may be used to implement a two-part material removal and separation process, wherein the first step comprises a hydrolysis (and potential dissolution) of the species being removed, and the second step comprises a chemical complexation of the species. The first layer 202 may be relatively thin compared to the second pad, and may be configured for hydrolysis (e.g. oxidation of metal species in some examples) of materials being removed in the planarization process. As such, the first layer 202 may comprise relatively larger pores, may be hydrophilic, and may be surface modified to functionalize the polymer surface, thereby allowing the polymer of the first layer 202 to participate in hydrolysis reactions. In some examples, the first layer may have a thickness in a range of 0.1 micron to five microns thick. Further, in some examples, the first layer may have an average pore size in a range of 10 nm to 1000 nm, preferably 30 nm to 200 nm. The first and second layers may be made from any suitable material or materials. In some examples, the first layer 202 and/or the second layer 204 may comprise one or more of polyurethane, polycarbonate, polyacrylate, polysulfone, polyester, polyacrylonitrile, polyethersulfone, polyarylsulfone, polyacrylonitrile, and polyvinylidene fluoride. Further, the first layer and/or the second layer may have a hardness 60-90 shore A or 30-60 shore D hardness.

Further, the porous polymer of the first and/or second layer may be designed with mechanical attributes such that it is rigid enough to handle the wafer load and the down force/applied pressures, and have a viscoelastic characteristics and physical attributes as determined by standard DMA, DSC and TGA methods such that, for example, a storage modulus is 15 MPa to 1200 MPa or preferably 400-800 MPa, a loss modulus is 100-600 MPa, preferably 150-500 MPa, a Tan delta (loss divided by storage) is 0.2-0.9, or preferably 0.4-0.8, a compressibility is <5%, and a surface tension is less than 40 mN/m.

The second layer 204 may be relatively thicker than the first layer, and may have relatively smaller pores than the first layer. In some examples, the second layer may be configured to retain materials removed by the first layer. For example, the second layer may comprise a surface that is chemically modified with metal complexing agents adsorbed or bonded to the second layer within the pores to retain metal ions removed from the substrate. In some examples, the second layer may have a thickness of several microns to 3 mm thick, and in more specific examples, from 40 microns to 2 mm thick. Further, in some examples, the second layer may have an average pore size in a range of 5 nm to 500 nm. The first layer and second layer may be joined together in any suitable manner, such as via an adhesive. In some examples, the porous pad 200 may be adhered or otherwise joined to an additional sub-layer, such as a woven textile matrix or soft polymer sheet (e.g. sub-pads of the type currently used for conventional CMP polishing pads). In some examples, the two layers will be integrated and seemingly compose a composite porous pad. In such examples, by virtue of having dissimilar characteristics between the top layer and the bottom layer, this constitutes an asymmetric porous media. Such an asymmetric porous media may, in some examples, include a gradual and systematic variation in pore characteristics, or may transition abruptly at the interface of two layers.

The porous polymer of the first layer and/or second layer may be fabricated in any suitable manner. In some examples, polymer phase inversion or phase separation may be used. In other examples, vapor induced phase Separation (Air Casting) may be used. As yet another example, liquid induced phase separation (immersion casting) may be used by dissolving polymer in solvent at room temperature and immersing in liquid non-solvent to induce phase separation. This enables different morphologies including asymmetric membranes. Methods for forming an asymmetrical structure (e.g. a multi-layer porous matrix) include manipulating phase separation conditions during single layer casting, casting a small pore size membrane on a large pore size substrate, simultaneously casting multi-layers of different pore sizes, laminating different pore size layers together, and utilizing temperature induced phase separation (TIPS or Melt Casting) (in which a polymer is heated above melting point and dissolved in porogens, and phase separation induced by cooling).

In other examples, hydrolysis and complexation both may be provided for by different functionalizing species in the first layer 202, and/or both in the second layer 204. Further, in some examples, a single layer porous pad may be used, such that hydrolysis and complexation are configured to occur in a same layer.

FIG. 2 also depicts contact between a substrate 206 and the porous pad 200. The substrate 206 may represent the substrate 108 of FIG. 1 in some examples. As shown in FIG. 2, contact between the substrate 206 and the porous pad 200 is limited to topologically higher regions of the substrate 206, such that the porous pad 200 does not contact topologically lower regions of the substrate. The use of relatively little pressure of the substrate 206 against the porous pad 200, combined with the hydrolysis chemistry being located within the porous pad 200 instead of in the space between the pad and substrate, helps to achieve removal of material from the topologically higher regions of the substrate 206 at a higher rate compared to, or even to the exclusion of, the topologically lower regions, as the topologically higher regions are in contact with the hydrolyzing environment in the porous pad.

The first layer 202 and the second layer 204 each may have any suitable morphology. In various examples, the first layer 202 and/or the second layer 204 each may comprise a laminar, hollow tubes or fiber, spiral wound, or sheet morphology.

Chemical planarization as disclosed in the examples herein offers various advantages over conventional chemical mechanical planarization. For example, selective material removal from topologically higher areas on a substrate may be accomplished using less pressure and motion between the substrate and pad, and no abrasive material in the slurry. This may help to mitigate or even eliminate randomness arising from mechanical aspects of conventional CMP (e.g. friction and relative rotations per minute of the pad and substrate), thereby making the process more predictable and amenable to modeling due to established chemical kinetics and diffusion. Further, the use of a pad conditioner also may be avoided. All of these factors may help to avoid defects arising from mechanical processes in conventional CMP processes, and thus may help to improve yield compared to conventional CMP processes. The disclosed examples may be chemically customizable for applications, and scalable to advanced materials and device designs in the future.

Further, the examples described herein may be implemented as a drop-in solution in conventional CMP machines, for example by using an abrasive-free planarization solution as disclosed in combination with lower pressure against the pad and lower rotational speeds. Other modifications that may be made to a conventional CMP machine as part of a drop-in solution include replacing the conventional CMP pad with a porous pad as disclosed, and replacing the pad conditioner with deionized water or other suitable cleaning solution. These proposed modifications may be positive, in that they may eliminate problematic steps or materials and lower cost relative to the conventional use of the CMP machine.

Figure 3:
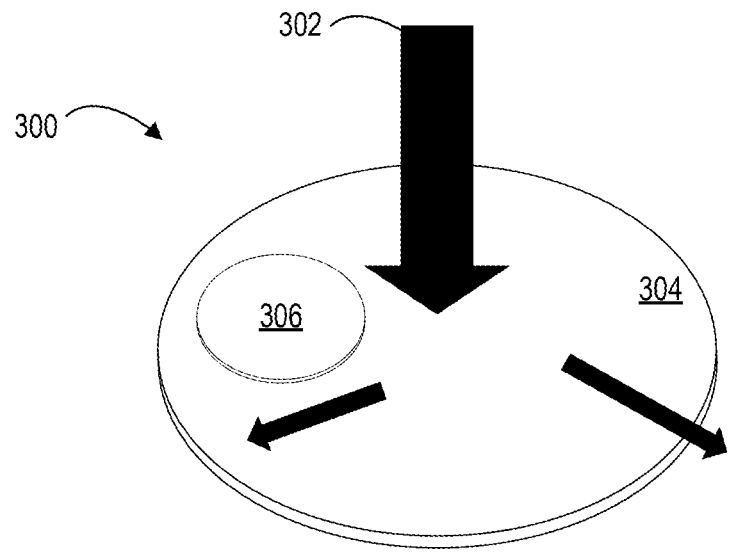
FIG. 3 shows a schematic depiction of an example rotary platform for delivering a chemical planarization solution to a substrate.

Referring briefly back to FIG. 1, system 100 is illustrated as comprising a rotary tool, in that the illustrated platen and/or substrate holder are configured to rotate to impart rotational motion of the substrate relative to the pad. In such an example, the planarization solution may be dispensed onto a central location of the porous pad. This is illustrated schematically in FIG. 3, which shows planarization solution (represented by arrow 302) dispensed onto a central portion of a porous pad 304. A substrate location is illustrated at 306. The planarization solution that is centrally deposited may flow outwardly through the porous pad, and thereby be distributed throughout a volume of the porous pad. Such flow may be facilitated by rotating the platen to which the porous pad is mounted. As mentioned above, the rate of rotation may be lower than a rate at which a platen rotates in a conventional CMP process, as the rotational motion is not being used in the examples herein to abrade material from a substrate.

Figure 4:
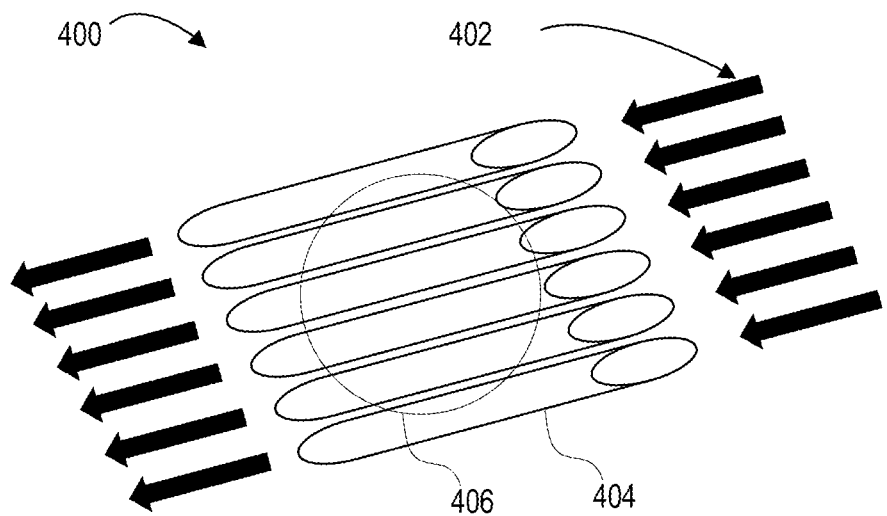
FIG. 4 shows a schematic depiction of an example hollow fiber membrane platform for delivering a chemical planarization solution to a substrate.

In other examples, any other mechanism may be used to distribute planarization solution than a rotary mechanism. FIG. 4 schematically shows an example of a hollow fiber membrane mechanism 400, in which the planarization solution 402 flows through hollow fibers 404. A substrate is illustrated schematically at 406. It will be understood that many different configurations and designs are possible for a variety of platform types (rotary, linear or belt style, vertically, rollers, hollow fibers). Further, in some examples, chemical materials may be reclaimed and re-used for cost economics and environmental reasons.

In some examples, where metals and alloy layers are being processed, the platen on which the porous pad is mounted can be configured as an anode, while the conducting substrate can be configured as a cathode, in some examples. The chemistry in between and in contact with the high topography areas will act as an electrolyte where electrolytic forces will be used to enhance selective removal, and thus enhance planarization. In this manner, electrochemically assisted selective removal for planarization can be implemented.

The planarization solution, in various examples, may be applied onto the porous pad at point-of-use (POU) before and/or during a substrate planarizing process. In some examples, chemistries can change during a planarizing process by changing recipe steps. Different chemistries can be added or changed in-situ to ensure the appropriate separation is taking place (e.g. dissimilar materials on device layers) and for controlling the process. Further, in some examples switching from one chemistry to another can be done in-situ during substrate planarization (e.g. using a rinse system between chemistries) and can also be defined specific to a different planarization/polishing chamber of a tool (e.g. a multi-plate tool). Additionally, where functionalized polymers are used for the porous pads, the functionalization may be regenerated, for example, by adding new functional groups in-situ (e.g. through the planarization solution dispensing mechanism) to bond to the polymer material(s) in the pad.

As described above, in some examples, a surface of a polymer material may be functionalized to provide hydrolytic, complexing, and/or other functionalities to the polymer. In such examples, the chemistries used for removing materials from a substrate and complexing the materials are fixed to the polymer surface and within the pores, rather than being loose in solution. As one example, a polyvinylidene fluoride (PVDF) porous layer or other suitable porous layer may be functionalized with a chelating agent such as poly (acrylic acid) to complex metal ions after removal from the substrate. The PVDF porous layer may be used either for a first layer or second layer in the example of FIG. 2. The polymer molecules may extend from a surface of the layer into a depth of the layer, and thus may transport metal ions away from a substrate surface after hydrolysis, thereby helping to prevent contamination of the surface and resulting defects. As another example, a porous PVDF polymer layer may be functionalized with a hyperbranched polyethylene by first hydroxylating the PVDF surface, then adding excess adipoyl chloride, and then reacting with the hyperbranched polyethylene. In yet other examples, the surface may be functionalized with a hydrolytic material, such as polydiallyldimethylammonium chloride, to hydrolyze substrate material during planarization. In other examples, any other suitable functionalization may be performed to impart any desired chemical functionality to the porous pad. Other examples of functional groups include, but are not limited to, —COOH, —NH2, —SO3H, —COOCH2CH2OH, —N(CH3)2, —PO3H2, —N(CH2CH2OH)2, and —CONHR.

Figure 5:
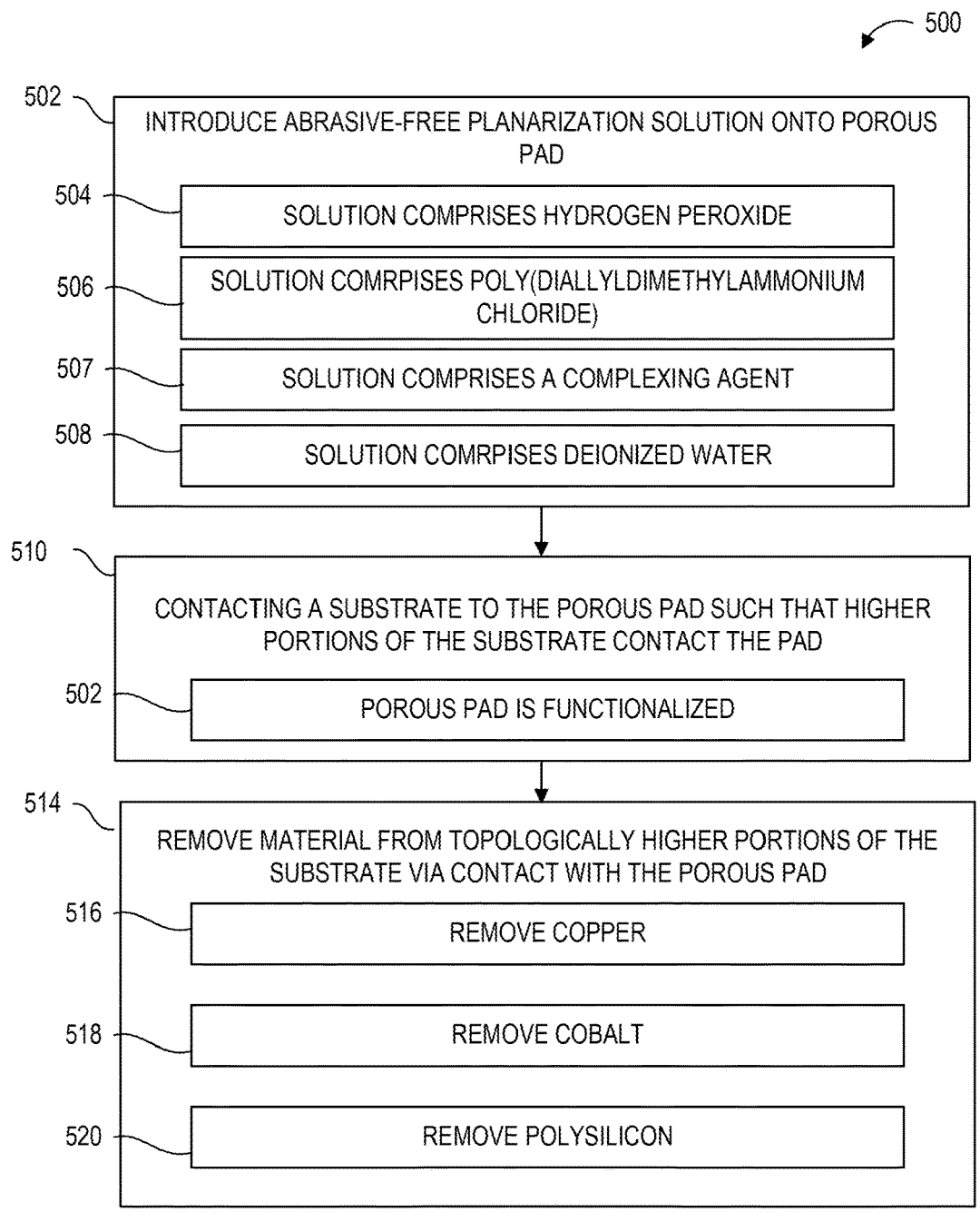
FIG. 5 shows a flow diagram depicting an example method for performing a chemical planarization process.

Any suitable method may be used to functionalize the polymers of the porous pad. In some examples, the polymer may be functionalized by coating, in which the functional groups are not cross-linked to the polymer substrate, but instead adsorbed. In another example, the functional group may be cross-linked. For example, a crosslinked co-polymer can be precipitated onto the porous polymer matrix of the porous pad. As yet another example, the functional group could be covalently bonded to the polymer FIG. 5 shows a flow diagram depicting an example method 500 for performing a chemical planarization process. Method 500 comprises, at 502, introducing an abrasive-free planarization solution onto a porous pad. In some examples, the planarization solution comprises chemical species to hydrolyze species on a substrate. As such, in various examples, the planarization solution may comprise hydrogen peroxide 504, poly(diallyldimethylammonium chloride) 506, and/or any other suitable hydrolyzing compound, such as various acids (nitric acid, hydrochloric acid, sulfuric acid, phosphoric acid, etc.). Further, in some examples, the planarization solution comprises a complexing agent 507, and other any other suitable components (stabilizers, passivators/anticorrosives, etc.). In other examples, hydrolyzing and complexing agents are functionally bonded to a polymer material of the porous pad. In such examples, the planarization solution may comprise deionized water 508, or another suitable solvent.

Method 500 further comprises, at 510, contacting a substrate with the porous pad, which may occur while moving the porous pad and substrate relative to one another, such that topologically higher portions of the substrate contact the porous pad while topologically lower portions of the substrate do not contact the porous pad. In some examples, the pad may be a functionalized polymer pad, as indicated at 512. The functionalized polymer pad may include bonded or adsorbed functional molecules/groups to perform hydrolysis, complexing, and/or any other additional chemical processes.

Method 500 further comprises, at 514, removing material from topologically higher portions of the substrate at a higher rate than materials from topologically lower portions of the substrate via contact with the porous pad to thereby planarize the substrate. In some examples, the material removed may comprise copper 516 or a copper-containing species, cobalt 518 or a cobalt-containing species, or polysilicon 520. In other examples, any other suitable materials may be removed in a planarization process. Other examples include one or more of tantalum, tantalum nitride, titanium, titanium nitride, and/or other similar refractory materials. As described above, as the hydrolyzation and complexing chemistry resides in the pad, material may be selectively removed from the substrate in areas that contact the pad, thereby planarizing the substrate.

EXPERIMENTAL RESULTS

Experiments were performed to determine the material removal rate (RR) of polysilicon (poly-Si), copper (Cu) and cobalt (Co) films using abrasive-free chemistries and simulating conditions for polishing with a pad embodying the chemical reagent as a proof of concept of a functionalized pad.

INTRODUCTION

Abrasive-free slurry of poly(diallyldimethylammonium chloride), or PDADMAC was used for poly-Si polishing removal rate studies. 250 ppm PDADMAC solution at pH 10 on a commercial IC1000 pad was used as a benchmark to compare with. Mixtures of oxalic acid and $H_2O_2$ were used to polish Cu without silica abrasives. Solution of 0.065 M oxalic acid and 1 wt % of $H_2O_2$ along with low Cu dissolution rate (DR).

In this work, abrasive-free slurries were used. Experiments were designed to pre-soak the pads with the chemistry before wafer polish, but terminate the chemical delivery during polish. Doing so, the polishing pad resembled the situation of embodying the chemistry in functionalized form. Polishing of poly-Si, Cu and Co films were conducted in the absences of a continuous supply of abrasive-free slurry.

Experimental
Materials

Poly-Si (~1000 nm), Cu (~1500 nm), and Co (~300 nm) films deposited on 200 mm Si wafers were used in these experiments. ACS reagent grade, PDADMAC (MW 200,000-350,000), oxalic acid and ammonium persulfate were used to prepare the abrasive-free slurries. The pH of the slurries was adjusted using $HNO_3$ or KOH as necessary.

Polishing Experiments

Initially, pads were wet with DI water for 10 min, followed by conditioning. Before the polishing, pads were soaked with the respective abrasive-free slurry for 5 min at a flow rate of 120 mL/min while rotating the platen. Then the rotation of the platen was stopped, and the soaking continued for 2 more min. Subsequently, wafers were polished by rotating the platen and carrier but without delivering the abrasive-free slurry on the pads. For comparison, the three types of films were polished while supplying the abrasive-free slurries at a flow rate of 60 or 120 mL/min. Two different polishers were employed to polish the poly-Si and two metal films (Cu and Co). The polishing conditions are given in the Table 1.

TABLE 1

| | Polishing conditions | |
|---|---|---|
| | Poly-Si | Cu and Co |
| Polisher | Allied METPREP-4 bench top polisher | CETR CP-4 bench top polisher |
| Pad | IC1000, Suba400, Fujibo-Polypas | Fujibo-Polypas, Politex |
| Wafer size | 2" diameter | 2 × 2 cm² |
| Wafer pressure | 4 psi | 3 psi |

TABLE 1-continued

| | Polishing conditions | |
|---|---|---|
| | Poly-Si | Cu and Co |
| Carrier/Platen speed | 72/80 rpm | 87/93 rpm |
| Polishing time | 60 s | 60 s |
| Slurry flow rate* | 60 or 120 mL/min. | 120 mL/min. |

*In case of soaked pads, slurry wasn't delivered during the polishing (flow rate = 0 mL/min)

The case of soaked pads is a direct look at a chemical species embodied pad, and may approximate the behavior of a functionalized pad. Since these are commercial pads, and not customized for any functionality, results are expected to be used for a proof of concept only. Any removal rate achieved in such situation is an evidence of the feasibility of a removal mechanism that does not require abrasives or delivery of a chemical reagent to the very top surface of the pad.

Results and Discussion
Removal Rates of Poly-Si Film

Table 2 lists the RRs of poly-Si films on Suba400 polishing pad soaked with abrasive-free slurry of 250 ppm PDADMAC solution at pH 10 along with the RRs on Suba400 (available from Eminess Technologies of Scottsdale, Ariz.), IC1000 (also available from Eminess Technologies) and Fujibo-Polypas (available from Fujibo Holdings, Inc. of Tokyo, Japan) polishing pads in the presence of a continuous abrasive-free slurry supply. RR of poly-Si on soaked Suba400 is ~639 nm/min, which is only 5-7% lower than the RR of poly-Si films polished with a continuous flow of PDADMAC abrasive-free slurry. RR on IC-1000 is similar to that of Suba-400, while the RR on soft Fujibo pad is <1 nm/min. Penta et al.[1] reported <200 nm/min RR for poly-Si films polished with pH 10 DI water (without PDADMAC), which is significantly lower than the RR on Suba-400 pad soaked with PDADMAC abrasive-free slurry, suggests that soaked Suba-400 pad was able to maintain a sufficient level of PDADMAC during the polishing even without the continuous delivery of the abrasive-free slurry.

However, the results on the Fujibo-Polypas indicate need for a chemical reformulation (or pH regime) in order to generate an expected removal rate. This is no indication of the pad, soaked versus dispensed, because the chemistry does not seem to be effective in the chosen condition for the Fujibo-Polypas pad.

TABLE 2

RRs of poly-Si films on various pads with or without abrasive-free slurry flow

| | RR of poly-Si (nm/min) | | | | | | |
|---|---|---|---|---|---|---|---|
| | Suba400 | | | IC1000 | | Fujibo-Polypas | |
| | With flow (mL/min) | | | With flow (mL/min) | | With flow (mL/min) | |
| Chemical solution | 120 | 60 | Soaked | 120 | 60 | 120 | 60 |
| 250 ppm of PDADMAC at pH 10 | 668 ± 12 | 681 ± 7 | 639 ± 19 | 658 ± 15 | 680 ± 15 | <1 | <1 |

Removal Rates of Cu and Co Films

The effect of abrasive-free slurry flow and pad type on Cu and Co RRs was investigated and obtained RRs are listed in Table 3. Cu RR of ~60 and ~74 nm/min were obtained by using soaked Fujibo-Polypas pad with abrasive-free slurries of 1 wt % $H_2O_2$+50 mM guanidine carbonate at pH 9 and 1 wt % $H_2O_2$+65 mM oxalic acid at pH 6, respectively. The selection of chemistry was based on the earlier work done[2-3]. The use of soaked Fujibo-Polypas and Politex pads showed positive removal rates indicating the feasibility of the concept. These are encouraging results when compared to commercial pads especially since the material has not been custom designed to optimize an optimal functionalized pad.

In case of Co polishing, 1 wt % of ammonium persulfate (APS) abrasive-free slurry at pH 9 didn't produce considerable RR to compare the two-polishing methods. Although the decrease of pH to 8 significantly enhanced the RR. This is another indication of the importance of the chemistry and the customization that is needed for a functionalized pad, where abrasives can be completely eliminated.

TABLE 3

RRs of Cu and Co films on various pads with or without abrasive-free slurry flow

|  | Fujibo-Polypas | | Politex |
|---|---|---|---|
|  | With flow (120 mL/min) | Soaked | Soaked |
| RR of Cu (nm/min) | | | |
| 1 wt % $H_2O_2$ + 50 mM Guanidine carbonate at pH 9 | 91 ± 4 | 60 ± 6 | 42 ± 5 |
| 1 wt % $H_2O_2$ + 65 mM Oxalic acid at pH 6 | 109 ± 3 | 74 ± 6 | 61 ± 3 |
| RR of Co (nm/min) | | | |
| 1 wt % Ammonium persulfate at pH 9 | 6 ± 1 | | |
| 1 wt % Ammonium persulfate at pH 8 | | >300 | >300 |

Summary of Experimental Results

For all three key applications for semiconductors, namely poly-Si, Cu and Co polish processes, abrasive free chemistries were successfully compared for a variety of commercial pad materials. The soaked pad condition represented a situation where the pad embodies the chemical reagent, and when no slurry is being delivered during polish. The 'soaked' pad condition showed feasibility of removal rate, and was comparable in some cases, to a conventional mode of polishing. The results are encouraging as the pad materials were not chemically functionalized to the extent desired in this proof-of concept study. Customization for functionality will be accomplished in subsequent stages of prototyping and product development. The results are crucial to forming the basis for formulating a polymer material and functionalizing the matrix to develop an innovative pad that can be a commercial pad not requiring an abrasive nor any complex chemistry.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A porous pad for performing abrasive-free chemical planarization of a substrate, the porous pad comprising:
   a first polymer layer configured to contact the substrate during the abrasive-free chemical planarization, the first polymer layer lacking an abrasive and comprising a first, larger average pore size within a range of 10 to 1000 nanometers and a first, lesser thickness, the first, lesser thickness being within a range of 0.1 to 5 microns;
   a second polymer layer positioned on an opposite side of the first polymer layer as a substrate-contacting side of the first polymer layer, the second polymer layer lacking an abrasive and comprising a second, smaller average pore size within a range of 5 to 500 nm and a second, greater thickness; and
   an abrasive free planarization chemistry disposed within pores of the first polymer layer and pores of the second polymer layer, the abrasive-free planarization chemistry comprising a functionalizing compound bonded to a surface of pores of the porous pad, the functionalizing compound comprising one or more of a complexing agent or a hydrolyzing agent.

2. The porous pad of claim 1, wherein the first polymer layer comprises a polymeric asymmetric membrane of hardness 60-90 shore A or 30-90 shore D.

3. The porous pad of claim 1, further comprising a sub-layer to which the porous pad is joined.

4. The porous pad of claim 1, wherein the functionalizing compound comprises a hydrolyzing agent comprising one or more of poly(diallyldimethylammonium chloride), poly(dimethylamine-co-epichlorohydrin-co-ethylenediamine), poly(allylamine), and poly(ethylene imine).

5. The porous pad of claim 1, wherein the one or more of the first polymer layer and the second polymer layer comprises one or more of a polyurethane, polycarbonate, polyacrylate, polysulfone, polyester, polyethersulfone, polyvinylidene fluoride, and polyacrylonitrile.

6. The porous pad of claim 1, wherein the first and second polymer layers are configured to allow an abrasive-free chemical planarization solution to flow through and thereby be distributed throughout the porous pad.

7. The porous pad of claim 1, wherein the functionalizing compound comprises one or more of a copper complexing agent, a cobalt complexing agent, a tantalum complexing agent, and a titanium complexing agent.

8. The porous pad of claim 1, wherein the functionalizing compound comprises a chelating agent.

9. The porous pad of claim 1, wherein the functionalizing compound is adsorbed onto one or more of the first polymer layer or the second polymer layer.

10. The porous pad of claim 1, wherein the functionalizing compound is bonded via a crosslinked co-polymer precipitated onto one or more of the first polymer layer or the second polymer layer.

11. The porous pad of claim 1, wherein the functionalizing compound is covalently bonded to one or more of the first polymer layer or the second polymer layer.

12. The porous pad of claim 8, wherein the chelating agent comprises one or more of poly(acrylic acid), ethylenediaminetetraacetic acid (EDTA), sulfosalicylic acid, napthol (PAN), dithizone, a organophosphorus acid ester, polyethylene glycol, an amine, and thioxin.

13. The porous pad of claim 1, wherein the second, greater thickness is within a range of 5 microns to 3 mm.

\* \* \* \* \*